United States Patent [19]

Rosch, III

[11] Patent Number: 4,506,687

[45] Date of Patent: Mar. 26, 1985

[54] PRINTED CIRCUIT PROCESSING APPARATUS

[75] Inventor: Hubert J. Rosch, III, Long Lake, Minn.

[73] Assignee: Circuit Services Corporation, Oak Brook, Ill.

[21] Appl. No.: 386,898

[22] Filed: Jun. 10, 1982

[51] Int. Cl.³ ............... B05C 15/00; H01L 21/68
[52] U.S. Cl. ........................ 134/83; 134/64 R; 134/199
[58] Field of Search ............ 134/64 R, 64 P, 83, 134/122 R, 122 P, 199, 61, 82; 156/640

[56] References Cited

U.S. PATENT DOCUMENTS

| | | | |
|---|---|---|---|
| 1,442,961 | 1/1923 | Marsh et al. | 198/463 |
| 2,689,657 | 9/1954 | Lens | 214/11 |
| 3,178,045 | 4/1965 | Davidson, Jr. et al. | 214/89 |
| 3,178,745 | 4/1965 | Kleebauer | 134/83 |
| 3,694,847 | 10/1972 | Hetman et al. | 15/302 |
| 4,067,293 | 1/1978 | Probst | 134/82 |
| 4,281,675 | 8/1981 | Pure | 134/125 |
| 4,427,019 | 1/1984 | Eidschun | 134/199 X |

FOREIGN PATENT DOCUMENTS

| | | | |
|---|---|---|---|
| 426225 | 2/1911 | France | 134/61 |
| 152239 | 11/1981 | Japan | 134/64 R |

Primary Examiner—John W. Shepperd
Assistant Examiner—Renee S. Kidorf
Attorney, Agent, or Firm—Kinney and Lange

[57] ABSTRACT

A printed circuit processing apparatus includes a modular tank arrangement with each of the tanks receiving a printed circuit board to be processed on edge, or in other words vertically, and which guides the printed circuit board through the tank for processing without leaving marks or "tracks" on the sides of the board. The boards are driven by rollers on which the lower edges of the boards rest. The boards are held vertically through the use of a plurality of vertically spaced longitudinally extending wires. Spray nozzles are positioned on opposite sides of the boards and are simultaneously operated to generally equalize the pressure on the opposite sides of the board. The spray nozzles contain the necessary solutions for processing the boards, and the guide wires are small enough so that they don't leave any areas of the board unprocessed, nor do they leave "tracks". The modular tanks permit one or several operations in a continuous path with connecting sections between the modular tanks.

15 Claims, 6 Drawing Figures

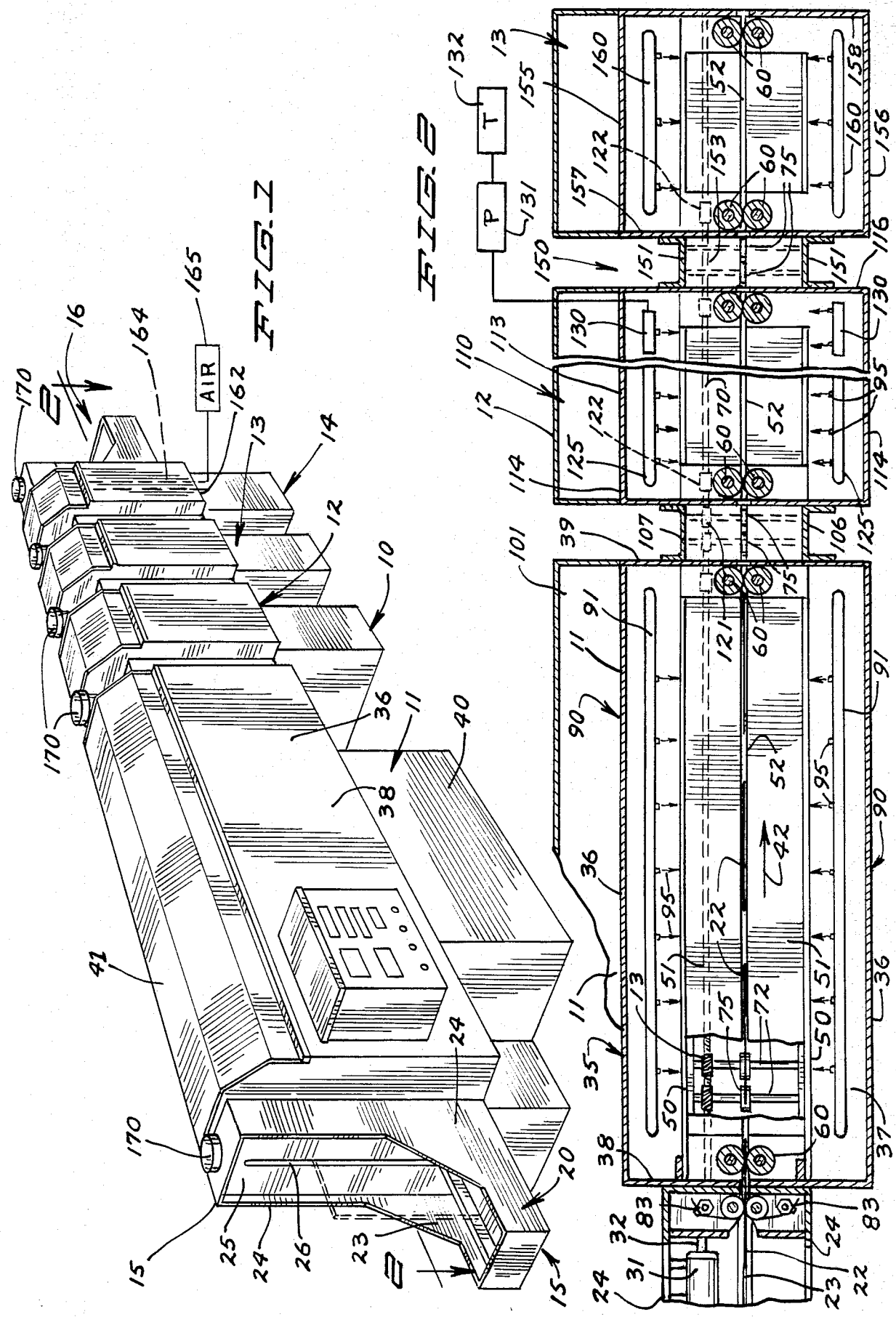

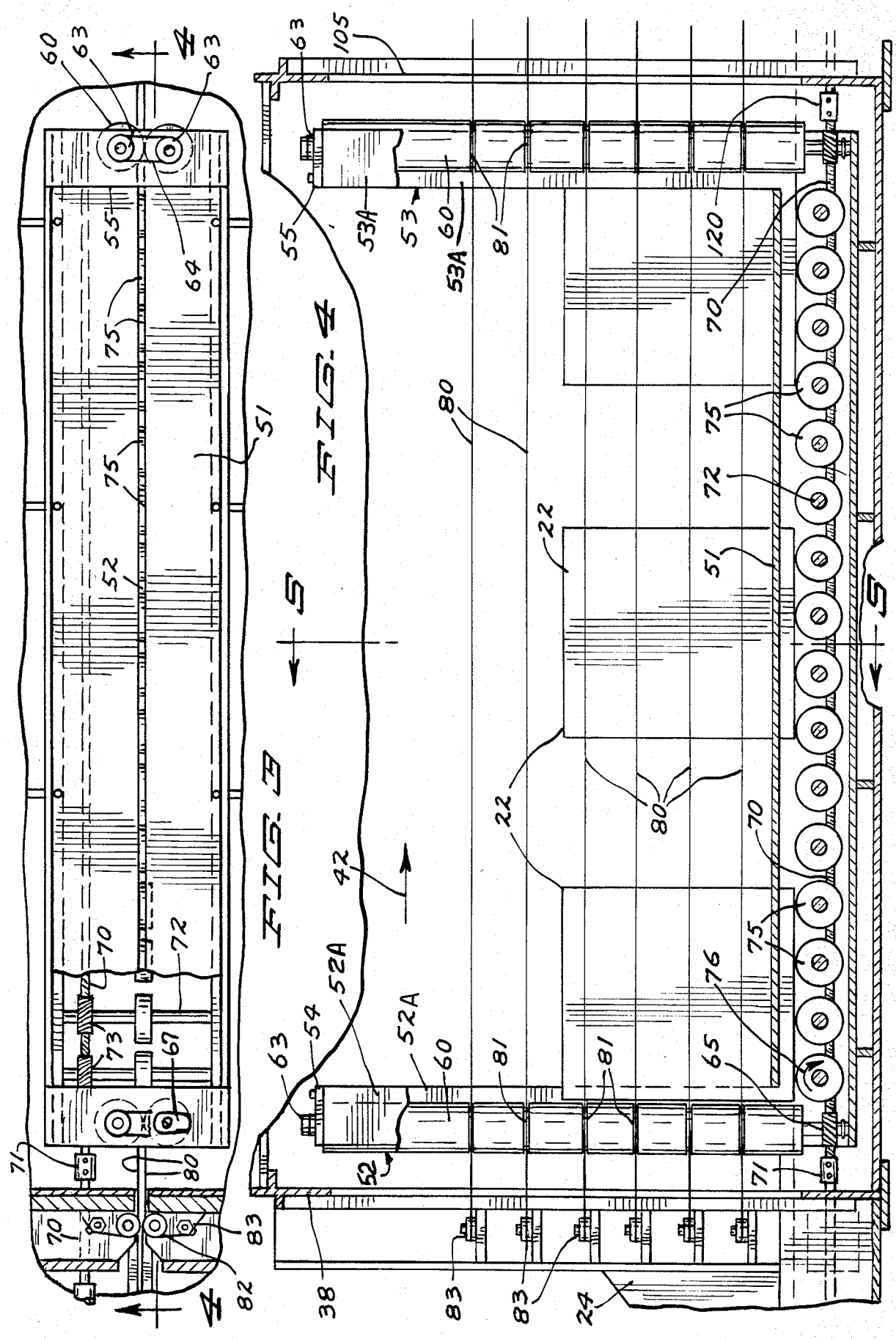

PRINTED CIRCUIT PROCESSING APPARATUS

BACKGROUND OF THE INVENTION

1. Field of the Invention

The present invention relates to apparatus for processing flexible boards that require a wet process in a continuous line while such boards are held with the plane of the board generally vertically.

2. Description of the Prior Art

In the prior art, various planar sheets have been processed for cleaning or "wet" processing on edge with the plane of the sheet vertical. For example, a window sash cleaner is shown in U.S. Pat. No. 3,694,847. A window sash is held on edge and passes through a processing machine. The machine has an opening slot that receives the sash, and it is moved along by elongated spaced rollers. A spray is used for part of the cleaning, and the window cleaning apparatus includes a vacuum chamber and wiper blades for drying. The device includes a plurality of guide rollers that engage the opposite sides of the sashes. Additionally, various operations such as brushing, and using wipers or squeegees are performed.

Rigid glass plates are handled on edge by the apparatus disclosed in U.S. Pat. No. 3,178,045. In FIG. 7 of this patent there is a guide for holding a glass sheet on edge and there are rollers used for guiding the sheet. The conveyor support in U.S. Pat. No. 3,178,045 is tiltable so that the sheet can be oriented in other than a vertical direction. A continuous glass sheet being processed is moved through a machine.

U.S. Pat. No. 1,442,961 shows an apparatus for handling steel sheets which has a succession of chambers, and the sheets are moved in series through the various chambers for work performance.

U.S. Pat. No. 4,281,675 shows a washing apparatus for insulated trays which uses a conveyor with clips to hold the trays on edge and spray heads act on the trays from opposite sides as they are processed.

Additionally, U.S. Pat. No. 2,689,657 shows a letter sorting machine which sorts letters or other flat objects when they are held on edge.

There also are prior systems which hold circuit boards generally vertically for processing, but these machines hold the circuit boards with clips or clamping grips. The problem remains in all of the cited prior art, as well as the known vertical oriented circuit board processing machines, of leaving tracks or marks on the board and not being able to process the board uniformly across its entire surface. The present device, through the use of the unique continuous drive, the guides, and the modular construction overcomes many of the limitations of the prior art.

SUMMARY OF THE INVENTION

The present invention relates to a machine and method for processing boards, such as printed circuit boards, which require wet processing, such as chemical etching. The machine supports the boards on edge and the boards (or a continuous web) are supported on drive rollers and moved through the machine as they are guided between sets of vertically spaced wires that extend parallel to the path of travel.

The processing includes spraying liquid on opposite sides of the boards as the boards move through the machine.

The processing apparatus comprises modular tanks, each including the board edge drive wheels and side guide wires. The tanks are joined by connector sections including connecting walls, and drive wheels also are positioned in the connecting sections. The guide wires extend continuously from one end of the apparatus to the other and thus pass through the connecting sections and through the modules that are coupled together.

The modular apparatus is capable of great flexibility to accommodate various processes for different types of boards. The modules also are easily joined into an apparatus assembly.

BRIEF DESCRIPTION OF THE DRAWINGS

FIG. 1 is a perspective view of a typical printed circuit board processing apparatus using the modules of the present invention;

FIG. 2 is a top sectional view of the device of FIG. 1 taken on line 2—2 in FIG. 1 with the end module broken away;

FIG. 3 is an enlarged top sectional view taken substantially on the same line as FIG. 2, showing one module in greater detail;

FIG. 4 is a sectional view taken as on line 4—4 in FIG. 3;

DETAILED DESCRIPTION OF THE PREFERRED EMBODIMENT

Figure 5:
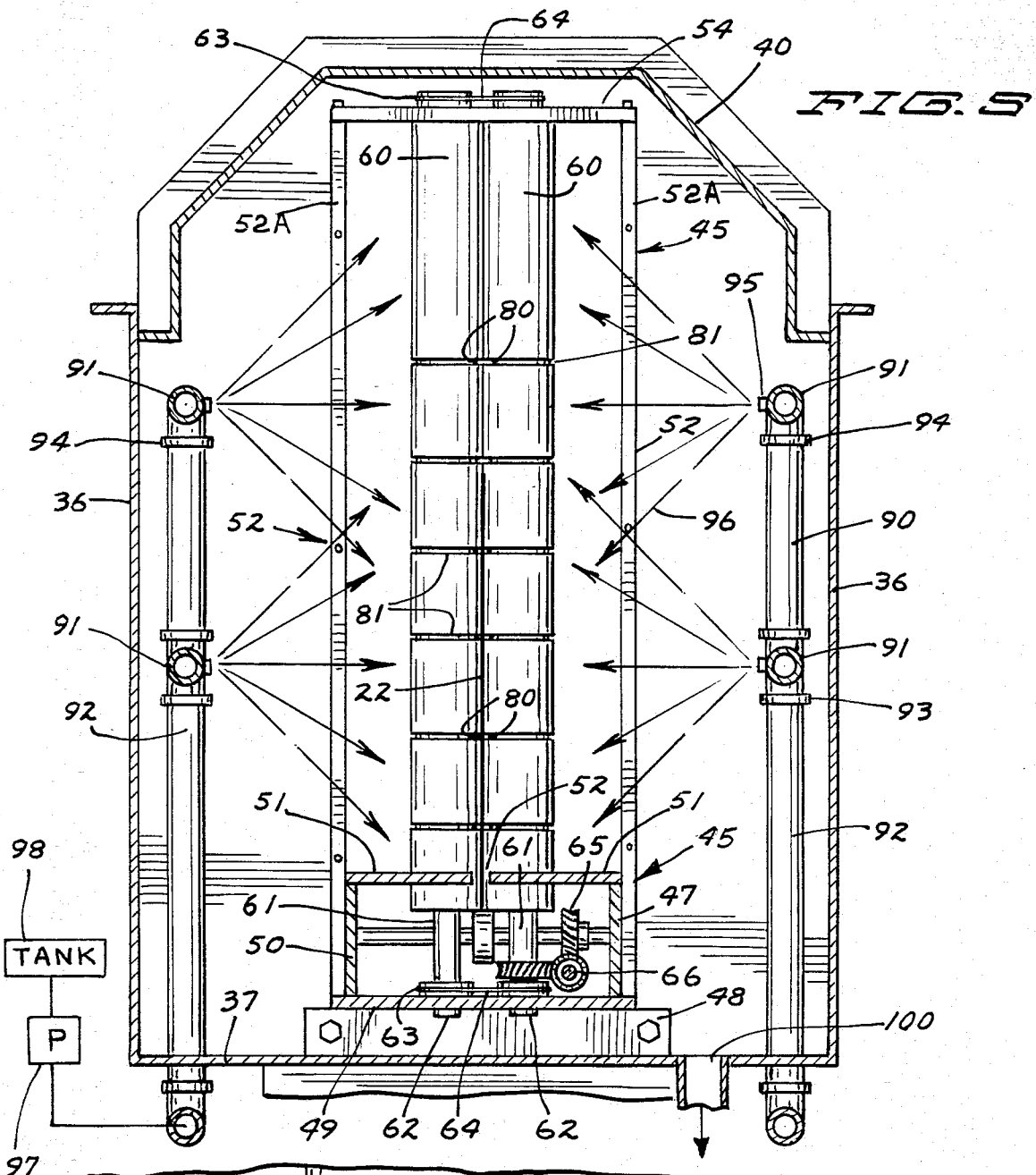
FIG. 5 is a sectional view taken as on line 5—5 in FIG. 4.

In FIG. 1, a typical printed circuit board processing line utilizing apparatus made according to the present invention and also practicing the process of the present invention is shown. The printed circuit processing apparatus indicated generally at 10 as shown is modular in construction and includes a first spray module 11 which usually is used for the primary step in the process, a second spray module 12, which is shown as somewhat shorter in length, a third spray module 13, a drying module 14 and an unloading module 16. While each of the spray modules are essentially identically constructed, there are variations as will be explained. The drying module is not shown in detail in that it merely involves the use of a drying blast or flow of air over the processed boards prior to unloading. In addition, there is a loading module 15 at the input end of the first spray module 11. The unloading module 16 is substantially identical to the loading module at the opposite end.

The device of the present invention is made so that each apparatus is made up of individual modules which can be connected together. Typically there are at least two of the modules connected together in series so that there is a develop, etch, or strip operation on the covering layers of the circuit boards being processed in the first module, and at least a rinse using the second module. Each of the modules is self contained as to the source of the material being sprayed, and also as to the recovery sumps which recover the spray material.

The input module 15 has a loading tray section 20 which as shown is made for loading individual circuit boards, but which can be adapted to receive a continuous sheet of very flexible circuit boards. Normally the boards are panels from about maximum of one-quarter inch thick down to 4 to 5 mils thick, and are very flexible. The boards may be made of a plastic material or other suitable material and may be copper clad. The boards generally are to be processed to define desired conductive paths on the board surfaces. The modules of the present invention as shown will take a board that is twenty four inches high, by as long as desired because the apparatus will process continuous lengths.

As shown, individual boards 22 are being processed, and they can be loaded through the loading tray 20 which has a board receiving slot 23. As shown, the loading tray has side walls 24,24 which form the tray, and of course has a bottom wall which encloses the loading tray. The tray, as well as the conveyor modules can be made of a suitable chemical resistant plastic such as polypropylene, which is quite easily joined together to form the modules, and is resistant to the chemicals normally used in the processing operation.

The loading module 20 has a panel 25 which includes a receiving slot 26 for receiving the printed circuit boards 22, (or a continuous sheet or panel) on edge once it has been placed into the slot 23. Additionally, the loading module 20 includes a drive motor 31 as shown in FIG. 2, which has an output shaft 32 that is suitably coupled to drive a drive shaft that is used for driving members to move the circuit boards along the length of the spray modules.

As shown in FIG. 2, there are several of the boards 22 spaced along the length of the first spray module 11. The spray module 11 includes a tank 35 that defines a spray chamber and which is made up of a pair of side walls 36, a bottom wall 37 and end walls 38 and 39. The tank 35 is supported on a pedestal 40, which generally houses the sump for collecting the drain liquids used in the spray operation. The same sump may be the supply tank for the pump used in spraying. A removable cover 41 is used over the tank. The cover 41 may be transparent if desired to permit viewing the process.

Each of the spray modules includes means for receiving the circuit board 22 (or planar panels) on edge, and for supporting and driving such boards along the length of the modules, for example in direction as indicated by the arrow 42.

FIGS. 3 and 4 illustrate in greater detail the drive structure for supporting and moving the boards to be processed. Each of the spray modules has the same interior drive structure, as will be explained, but the lengths of the modules are different.

In module 11, a drive frame assembly indicated generally at 45 is removably mounted on the floor 37 of the module 11. The frame assembly (see also FIGS. 5 and 6) includes a longitudinally extending base frame member 47 supported on and fixed to suitable connector members 48. The base frame member 47 includes a base plate 49, and upright side members 50 which are fixed as an assembly (welded). The drive frame assembly 45 is made out of polypropylene, or suitable nonreactive material. A pair of top panels 51,51 are supported on the upper edges of upright walls 50, and are spaced to define a circuit board receiving slot 52 therebetween which extends longitudinally along the length of each of the respective modules.

At the ends of the frame 47 there are upright frame portions 52 and 53 at the input and output ends, respectively (see FIG. 4). The frames 52 and 53 each comprise a pair of upright members 52A and 53A, respectively, which are supported by the frame 47. Cross plates 54 and 55, respectively are mounted on and connect the upper ends of members 52A and 53A, respectively. At the input end frame 52, there are a pair of input pinch rollers 60,60 which are rotatably mounted on suitable shafts about upright axes, and are closely spaced together as shown in FIG. 5. Shafts 61 are used for mounting the pinch rollers 60 and the shafts are rotatably mounted as at 62 in bearings supported on the lower plate 49 of the frame 45, and the upper ends of the shafts 61 are rotatably mounted in bearings supported on the cross plates 54 and 55, respectively. The shafts 61 each at their upper and lower ends have pulleys 63 mounted thereon, with an elastic belt 64 extending between the pulleys.

A worm wheel 65 is drivably mounted on the shaft 61 of a first one of the pinch rollers 60 of each pair and is driven by a worm gear 66. The worm gear 66 is drivably mounted on a drive shaft 70. The shaft 70 is driven by the motor 31 through a coupling 71 that is of conventional design. The shaft 70 as will be explained extends along the entire length of each of the respective conveyor modules and is suitably mounted on bearings at desired locations.

Note that there is a worm wheel 65 at the unloading pinch rollers as well, also driven from the shaft 70.

The bearings for each gear-driven pinch roller 60 are held securely in their supports, but the bearings for the nondriven pinch roller are mounted in transverse slots in their respective supports, for example slot 67, in top plate 54 as shown in FIG. 3. There is a slot in each mounting plate for the nondriven roller so the nondriven roller can "float" or move sideways relative to its driven, mating roller. The elastic belts 64 over pulleys 63 provide a resilient or biasing force that urges the rollers together. The rollers thus will drive boards of different thickness and can move apart to accommodate such thickness differences. The belts 64 also serve to drive the nongear driven roller of each pair of rollers.

Figure 6:
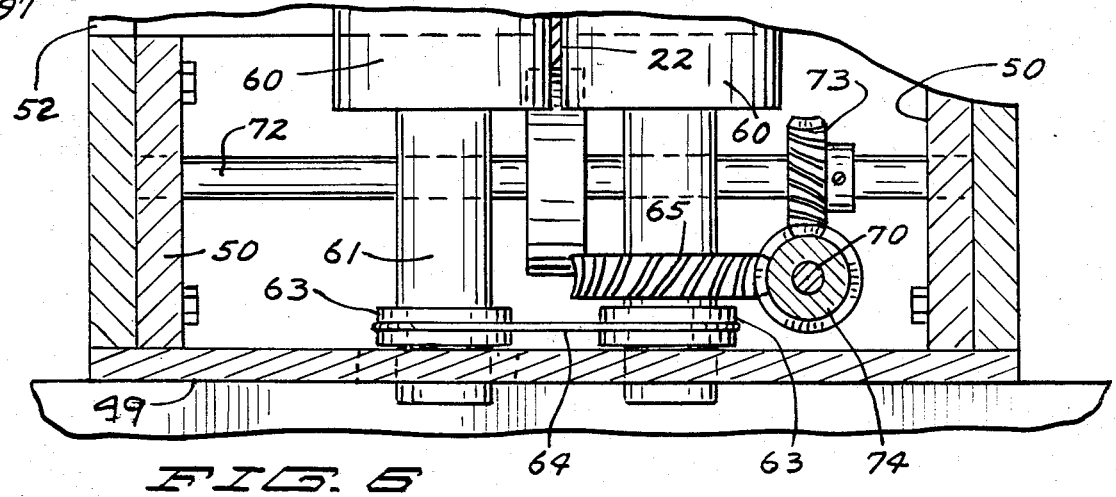
FIG. 6 is an enlarged end sectional view showing typically a drive arrangement for the device of the present invention.

The frame assembly 45 can be made of proper length to be fitted within the tank of each of the spray modules used in the process. The side walls 50,50 of base frame 47 as perhaps best shown in FIGS. 4, 5 and 6 are used for mounting a plurality of generally parallel cross shafts 72. The shafts 72 extend across the frame 45, and are rotatably supported in the side walls 50 which as was stated, are polypropylene or suitable low friction material.

Each of the cross shafts 72 is driven by a worm wheel 73 that is drivably mounted on the respective shaft 72. The worm wheels 73 are directly aligned with individual worm gears 74 that are drivably mounted on the shaft 70 in the same manner as the worm gear 66 was mounted. Additionally, each of the shafts 72 has a disc or wheel 75 drivably mounted in the center thereof and aligning with the slot 52 between the edges of the panels 51,51. These discs 75 as shown are spaced at regularly spaced intervals along the length of the individual modules, and the circuit boards 22 being processed are supported on these discs 75. The discs 75 are made of relatively high friction material such as a polymer or rubber, and it should be noted that the discs rotate in a suitable direction as indicated by the arrow 76 in FIG. 4. The discs support the circuit boards 22 and drive the circuit boards in the direction indicated by arrow 42.

In order to hold circuit boards 22, or a continuous panel being processed upright, and in order to avoid the need for clips or large side guide wheels which leave tracks on the boards, a plurality of vertically spaced longitudinally extending wires are used for guides on opposite sides of the board. These wires are indicated at 80, and are positioned so that as shown there is a separate set of six wires vertically spaced on each of the respective sides of the circuit board panel. Each set of wires lie in a plane adjacent opposite sides of a board 22 in the module. The wires are of suitable material compatible with the solutions used in processing. For example, stainless steel wire may be used in many applications.

The wires 80 are guided in grooves 81 which are formed in the rollers 60 at both the loading and unloading ends of the frame assembly 45. The wires start in the loading module, and then pass completely through the entire assembly of the individual modules, depending on how many modules are used, and are fastened at the unloading end as well. As shown in FIG. 3, the typical mounting for each wire 80 shows that the wires pass through the loading slot 26 and around suitable guide rollers 82 which are mounted on support walls formed on the loading module, and then they are fastened with suitable attachment lugs or clamps shown at 83. The tension in the vertically spaced stainless steel guide wires 80 can be adjusted by adjusting the clamps 83 in the manner desired. The wire attachment members for the unloading end of the assembly of module units are exactly the same. Of course other ways of fastening the wires 80 can be used. The vertical spacing of the wires 25 can be altered as well, but the wires provide lateral guides for the boards or panels being processed as the boards move through the individual spray modules, without leaving any substantial surface areas unprocessed and without leaving any marks on the boards.

The processing of the circuit boards is the normal processing such as a photo etch processing, i.e. developing, then etching, and then stripping. Other processes can be used as well. In each of the processes however, some type of a liquid chemical material, or liquid rinse has to be sprayed upon the opposite sides of the boards where circuit paths are to be formed.

FIGS. 2 and 5 show typical arrangements for spraying the boards with the desired chemical or rinse as the circuit boards are moved through the individual modules. A separate spray head assembly 91 is mounted on the opposite sides of the tank 35 forming the first module 11. This is a typical showing that is used in the modules 12 and 13 as well, and as can be seen in FIG. 2, the spray head assemblies 90 extend along the length of the tank 35 and are enclosed within the tank.

The spray head assemblies 90 include longitudinally extending, generally horizontal spray pipes 91 that are supported in a desired manner relative to the tank 35, and this support can be merely upright members including upright supply pipes 92 that are connected with suitable connectors 93 and 94 to the longitudinally extending spray pipes 91. Each of the spray heads has a plurality of nozzles 95 mounted thereon which are positioned to spray liquid indicated generally at 96 toward the center of the tank, and thus toward the circuit board panels 22 being processed. Note that the nozzles 95 are generally aligned with the nozzles 95 of the spray head on the opposite side of the panel, so that when liquid under pressure is being sprayed on the panels the spray forces tend to balance and the panels will tend to remain upright without any undue pressure on the guide wires 80.

The spray head assemblies can be easily removed from the chamber or tank of the respective spray module by disconnecting suitable fittings. Also, the frame assemblies 45 can be easily removed as a unit (including the pinch roller sets) for repair or cleaning. The couplings for the shaft 70 are removed and when wires 80 have been loosened or removed, the frame assembly 45 can be lifted out by releasing a few fasteners.

The chemicals being used in the spray heads can be provided through a pump 97 from the sump or supply tank 98 as shown schematically in FIG. 5.

The spray modules typically also include drain openings indicated at 100 in FIG. 5 to the sump or tank 98. The chemicals can be heated, cooled, renewed, or otherwise treated as desired so that the excess chemicals do not become lost. The supply tanks or sumps preferably are compartments forming part of the pedestals 40 but can be separate if desired. The openings 100 may be in any desired location in the respective spray modules.

The drive shaft 70, motor 31, and the gear drives for the pinch rollers and discs can be on the opposite side of the frame assemblies 45 if desired. The positioning of the common drive shaft 70 is not critical to operation.

Thus it can be seen that as the circuit boards 22 move through the first spray module 11, the spray nozzles 95 provide a spray of the chemical desired against the sides of the circuit boards for processing. The boards are driven while on edge so that they drain well and are guided by the very thin wires 80 which do not interfere with the processing nor do they leave any tracks or marks on the panels. As the panels being processed in the first module 11 pass out through the unloading pinch roller set 60, the panels then come to end wall 39 and pass out through a vertically extending slot 105. Note that the wires 80 also pass through the slot 105, and across a transition or connector section 106 that is a housing having side walls 107 fastened to the wall 39 at the unloading end of the first spray module 11 and also fastened to a tank 113 of the second spray module 12. The section 106 also includes a bottom wall and a cover or top wall. A pair of shafts 72 with discs 75 thereon are mounted in the transition section 106 on supports similar to the walls 50 to drive the boards across the transition section 106. The shafts 72 are driven by a connector section shaft 121 coupled to the shaft 70. The circuit boards passing from the first spray module 11 to the second spray module 12 are enclosed within the housing formed by the side walls 107 as well as the cover and bottom walls. The circuit boards pass through a suitable vertical slot into the tank 113 of the second spray module 12.

The tank 113 includes side walls 114,114, a loading end wall 115 in which the circuit board receiving slot is formed, and an unloading end wall 116. In addition, a cover 118 is provided over the tank 112 as well.

The longitudinally extending shaft 70 of first spray module 11 is coupled with a suitable direct coupling 120 to a connector shaft section 121 which in turn is connected with a coupling 122 to the shaft 70 in the second spray module.

The second spray module 12 has spray heads 125 at the loading end thereof which can be used for spraying suitable chemicals, just as described in relation to spray heads 90. The second spray module also has short sections of spray heads shown at 130. The spray heads 130 are adjacent the unloading end of the module. The split or separate spray heads 125 and 130 can be used to carry out two spray operations in one module. For example spray heads 125 may be used for a rinse (after etching in module 11) and then a neutralizer may be sprayed from the spray heads 130.

The spray heads 130 may be connected to a separate pump and tank shown at 131, 132 which are separate from the pumps and tanks that would be used for the spray heads 125.

A second connector or transition section 150 is positioned between the unloading end of the second spray module 12 and the loading end of the third spray module shown at 13. The transition section 150 is substantially identical to that shown at 106, and includes side walls 151 and 152, as well as a cover and bottom walls. A suitable shaft section 153 is coupled to the shaft section 70 of the second spray module 12 at one end and to a shaft 70 from third spray module 13 at its other end. The circuit boards or panels being processed pass from the second module 12 through the unloading pinch rollers 60 of module 12, across the transition or connector section 150 (which also has two drive discs 75) and into the loading pinch rollers 60 of the third spray module 13. Again, the modules 12 and 13 have the same type of framework supporting the drive discs, and the panels 51 defining a slot 52 so that the individual circuit boards ride on the discs 75 which are driven by the cross shafts in modules 12 and 13 in the same manner as those in module 11.

The spray module 13 includes a tank 155 which has side walls 156, an end wall 157 at the loading end and an end wall 158 at the unloading end. The tank 155 includes a bottom wall and a cover 159. Additionally, spray heads 160,160 are positioned on opposite sides of the path of movement of the circuit boards in tank 155 and can be used for spraying a desired liquid material onto the circuit boards or panels being passed through this module in the same manner as previously described in connection with the first and second modules. The third module 13 of course is of different length, but it does include the loading pinch roller set 60, and the unloading pinch roller set 60 formed in the same manner as previously described.

The module 14 shown in FIG. 1 is the drying module, and includes a tank 162 in which two vertical tubes such as that shown in dotted lines 163 are mounted. These tubes can have openings that direct air toward the opposite sides of a circuit board after the board has passed through the unloading pinch rollers 53 of the last spray module in the series. The air can come from a high volume source 165 which can be of any desired form. There is also an unloading tray module at the end of the processing section which is substantially similar to the loading module shown in FIG. 1.

Additionally it should be noted that the connector or transition sections 106 and 150 and also the loading, drying and unloading modules have exhaust stacks or pipes indicted at 170 on the upper walls thereof. These stacks 170 can be connected to a suitable exhaust system for removing fumes from the process.

At the unloading end of the entire processing line the ends of wires 80 are held on the unloading module in the same way that they are held in the loading module. The wires 80 are guided through grooves that are vertically spaced on each of the pinch rollers in the pinch roller assemblies.

Thus, a typical process can be made by using individual spray modules processing vertically oriented circuit boards or planar panels. For example in module 11 a developing process in conjunction with a photo sensitive material is sprayed by the spray heads onto the panel. The pinch rollers will guide the panels out through the unloading end, into the interconnecting section, where there is a vent. The boards move into the loading end of the next module 12, where for example as shown there can be a split spray head including a rinse sprayed by the spray heads 125, and then a neutralizing chemical sprayed by the spray heads 130,130. The circuit boards then will exit into the transition section 150, which again has a vent 170, and into a rinse spray module 13. The spray heads 160 in module 13 can be connected to a suitable rinse water or other liquid, after which the circuit boards may be removed, or as shown the boards may pass through an interconnecting section into the air dry module where a forced flow of air from the air source 165 will dry the boards. The boards will exit to the unloading module for unloading.

During the processing the boards are guided in their upright, on edge position by the very fine wires, and are driven by the individually driven discs which are positively driven and timed through the gear drives from a common shaft. The drive shafts can be easily mechanically coupled and interconnected between the various modules.

One or more spray modules can be used in series as shown, and if desired the modules can be placed side by side and the boards then unloaded manually from one and placed into the other spray module. Of course various automatic controls can be utilized for sensing temperature volume and the like. The unit can be set up to wet process any type of board that has to be processed whether it needs a develop, rinse and dry sequence; an etch, rinse and dry sequence, or a stripping process with a rinse and dry sequence. The vertical orientation of the boards permits the processing apparatus to be more compact and take less floor space, and in general provides for an efficient relatively low cost operation.

Because the boards are not horizontal but rather vertical, they drain well and there is no puddling of chemicals. There are no conveyor wheel tracks on the sides of the boards and more uniform, as well as faster processing is possible. The modules provide flexibility in setting up the processing lines to suit individual needs.

What is claimed is:

1. Means for processing printed circuit boards in a wet process comprising a tank, pedestal means below and supporting said tank comprising means forming a sump and supply reservoir for liquids used in the tank, means within said tank for guiding boards to be processed in position so that the surfaces of a board are substantially vertical, a pair of input guide rollers rotatably mounted adjacent at least one end of said tank about vertical axes and being closely spaced to permit a board to be guided in a vertical position and driven toward the means for guiding, a plurality of spray heads positioned on opposite sides of said tank, and on opposite side of a board being guided by said means for guiding, pump means connected to said sump to provide liquid to said spray heads to spray a liquid on opposite sides of a board guided in the means for guiding simultaneously, drain means from said tank leading to said sump; cover means mounted on said tank and enclosing said tank, and means comprising a plurality of drive discs within said tank, mounted about generally parallel horizontal axes transverse to the direction of movement of a board in the means for guiding, the discs having their peripheries positioned adjacent each other for supporting a lower edge of a board being guided in said means for guiding on upper portions of the discs, said boards being supported under gravity in vertical direction on said drive discs only and the drive discs being driven to propel a supported board in a first direction from the input guide rollers toward an opposite end of said tank from said input guide rollers.

2. The means for processing of claim 1, wherein said plurality of spray heads comprise at least two generally horizontal tubes on opposite sides of the board to be processed, and nozzle means substantially uniformly spaced longitudinally along said tubes to aid in maintaining the boards oriented in longitudinal direction as the boards are moved by the discs.

3. The means for processing of claim 1 wherein said discs comprise high friction elastomeric material.

4. The apparatus of claim 1 wherein the input guide rollers are adjacent the input end of said tank and said tank has a second pair of vertically oriented guide rollers near the opposite end thereof, and said discs driving supported boards from the first mentioned pair of rollers to the second pair of guide rollers.

5. The apparatus of claim 4 wherein the rollers of each pair of rollers are resiliently loaded toward each other.

6. The apparatus of claim 1 wherein said means for guiding comprise a plurality of generally vertically spaced wires arranged in a pair of sets of wires, each set defining generally a vertical plane that is spaced from the vertical plane of the other set of wires, and a board to be processed being adapted to be driven by the discs to pass between the wire set planes.

7. The apparatus of claim 6 wherein said guide rollers have vertically spaced grooves for guiding said wires and maintaining them in vertically spaced relationship.

8. The apparatus of claim 6 and means to adjust the length of the wires in each of the sets.

9. A modular printed circuit board processing apparatus comprising a first spray module including an enclosed first tank having side walls, a bottom wall, end wall means extending between the side walls, and a cover member to enclose the tank, a plurality of rotatable first discs mounted within said first tank to support a generally planar circuit board with the plane of the circuit board being generally vertical, said first discs having axes extending transverse to the plane of a circuit board supported thereon, first drive means within the first tank to drive each of the first discs to propel such planar circuit board from a loading end of said first module to an unloading end of said first module, a second module including a second tank constructed as said first tank and a plurality of second discs mounted within the second tank on axes parallel to the axes of the discs in the first tank to support a circuit board within the second tank parallel to circuit boards supported in said first tank, second drive means within the second tank to drive each second disc to propel circuit boards supported thereon from a first end of the second module adjacent the first module to a second unloading end thereof, said tanks each having aligned vertical slots in the ends thereof for ingress and egress of circuit boards to be processed, an enclosed transition section having means to transport circuit boards from the egress slot of the first tank to the ingress slot of the second tank, circuit boards being processed being supported in vertical direction within the tanks solely by the first and second discs within the respective tank whereby the cover member of each tank has no opening for circuit board supports, said drive means including means drivably coupled from the first module to the second module through said transition section, and exhaust means in the transition section for removing fumes from the modules and transition section.

10. The apparatus of claim 7 wherein each of said modules has separate drain means for receiving material that drains off the planar members.

11. The combination as specified in claim 9 wherein said drive shaft comprises a shaft extending through the first module, and having a section in the second module, means to couple the drive shaft from the first module to the shaft section of the second module, and a single motor driving the drive shaft.

12. The apparatus of claim 8 wherein the drive means comprises a plurality of cross shafts extending generaly perpendicular to the plane of a planar member being processed, a disc on each cross shaft, the lower edge of a circuit board being processed resting on a plurality of discs, and gear means operable between the drive shaft and the cross shafts to positively drive each of the discs and thereby propel a circuit board supported on the discs.

13. The apparatus of claim 9 and means to guide circuit boards within each tank comprising vertically spaced sets of wires extending continuously longitudinally from the loading end of the first module through the transition section to the unloading end of the second module.

14. The apparatus of claim 13 wherein said sets of wires comprise two sets, each set having a plurality of wires substantially defining a plane, the planes of the sets being spaced laterally apart, in position so that a planar member being processed passes between the wire set planes.

15. Means for processing printed circuit boards in a wet process comprising a tank having walls forming an enclosure and including vertical slot means at opposite ends thereof of size for permitting ingress and egress of printed circuit boards to be processed, means completely within said tank for supporting circuit boards to be processed in position within the tank so that the plane of a circuit board is substantially vertical and in alignment with the slot means, a pair of generally vertical input guide and drive rollers positioned adjacent at least one end of said tank and in alignment with one slot means to permit a board to be guided through the slot means in a vertical position toward the means to guide, a plurality of spray heads positioned within the tank on opposite sides of a circuit board being guided by said means to guide, said spray heads being effective to spray a liquid on opposite sides of such circuit board simultaneously, means for moving a circuit board from one end of the tank to the other comprising a plurality of discs mounted for rotation on transverse horizontal axes, power drive means within the tank to drive each of said discs, the discs being mounted within the tank and adjacent each other to support and drive a lower edge of a circuit board being guided in said means to guide as the discs are rotated, the means to move a circuit board comprising only the discs whereby there is no longitudinal slot in the tank to accommodate overhead supports for the boards as the boards are moved through the tank, and exhaust system means adjacent at least one of the slot means for removing fumes from the tank.

* * * * *